United States Patent
Shen et al.

(10) Patent No.: US 10,803,218 B1
(45) Date of Patent: Oct. 13, 2020

(54) PROCESSOR-IMPLEMENTED SYSTEMS USING NEURAL NETWORKS FOR SIMULATING HIGH QUANTILE BEHAVIORS IN PHYSICAL SYSTEMS

(71) Applicant: Ansys, Inc., Canonsburg, PA (US)

(72) Inventors: Qian Shen, Southborough, MA (US); Joao Geada, Chelmsford, MA (US); Robert Geada, Chelmsford, MA (US)

(73) Assignee: ANSYS, INC, Canonsburg, PA (US)

( * ) Notice: Subject to any disclaimer, the term of this patent is extended or adjusted under 35 U.S.C. 154(b) by 0 days.

(21) Appl. No.: 16/223,921

(22) Filed: Dec. 18, 2018

Related U.S. Application Data

(60) Provisional application No. 62/608,744, filed on Dec. 21, 2017.

(51) Int. Cl.
| | | |
|---|---|---|
| G06F 17/50 | (2006.01) | |
| G06F 30/3312 | (2020.01) | |
| G06N 3/04 | (2006.01) | |
| G06F 30/39 | (2020.01) | |

(52) U.S. Cl.
CPC .......... *G06F 30/3312* (2020.01); *G06F 30/39* (2020.01); *G06N 3/0454* (2013.01)

(58) Field of Classification Search
CPC .... G06F 30/3312; G06F 30/39; G06N 3/0454
USPC ........ 716/101–104, 106, 111, 113, 116–117, 716/121–122, 136, 138
See application file for complete search history.

(56) References Cited

U.S. PATENT DOCUMENTS

| | | | | |
|---|---|---|---|---|
| 9,798,575 B2 * | 10/2017 | Chen | ....................... | G06F 17/18 |
| 10,061,300 B1 * | 8/2018 | Coffman | ................ | G06N 3/126 |
| 10,133,981 B2 * | 11/2018 | Cleve | ....................... | G06N 3/10 |
| 2010/0077372 A1 * | 3/2010 | Xiang | ................. | G06F 17/5009 |
| | | | | 716/106 |
| 2018/0181541 A1 * | 6/2018 | Yao | ......................... | G06F 17/11 |

* cited by examiner

*Primary Examiner* — Nghia M Doan
(74) *Attorney, Agent, or Firm* — Wen-Jeng Vincent Lue

(57) ABSTRACT

Systems and methods are provided for simulating quantile behavior of a physical system. A plurality of parameter samples to a physical system are accessed and a subset of the parameter samples are identified, each of the plurality of parameter samples including a variation of parameters for the physical system. The physical system is simulated based on the subset of the parameter samples to generate simulation results, each of the subset of the parameter samples corresponding to a respective one of the simulation results. A neural network is trained to predict the simulation results based on the subset of the parameter samples. Simulation results are predicted for the plurality of parameter samples based on the neural network which has been trained, each of the predicted simulation results corresponding to a respective one of the plurality of parameter samples, and an indicator is generated indicating a quantile simulation result of the physical system according to an ordering relationship among the plurality of simulation results.

20 Claims, 11 Drawing Sheets

|  | Fin 1 Width | Fin 2 Width | Fin 3 Width |
|---|---|---|---|
| Input 1 | 7.2 | 6.8 | 7.0 |
| Input 2 | 6.5 | 7.9 | 7.1 |
| Input 3 | 7.0 | 6.5 | 7.0 |
| Input 4 | 6.5 | 7.3 | 7.1 |
| ... | | | |
| Input X | 6.8 | 7.0 | 7.0 |

FIG. 2

$1^{ST}$ = 15 VOTES, $2^{ND}$ = 14 VOTES ... $15^{TH}$ = 1 VOTE

| | NEURAL NETWORK 1 | NEURAL NETWORK 2 | ... | NEURAL NETWORK L | |
|---|---|---|---|---|---|
| PARAMETER SAMPLE 1 | 1ST | 8TH | | 31ST | 23 VOTES |
| PARAMETER SAMPLE 2 | 10TH | 4TH | | 9TH | 25 VOTES |
| ... | | | | | |
| PARAMETER SAMPLE M | 105TH | 88TH | | 12TH | 4 VOTES |

FIG. 6

| circuit | # of runs | mean sims | median sims | mean error % | median error % |
|---|---|---|---|---|---|
| Flip-flop 1 | 100 | 51.95 | 52 | 0.78% | 0.00% |
| Flip-flop 2 | 100 | 68.69 | 69 | -1.17% | 0.00% |
| Flip-flop 3 | 100 | 44.87 | 44 | 0.00% | 0.00% |
| Flip-flop 4 | 100 | 70.9 | 71 | -0.11% | 0.00% |
| Flip-flop 5 | 100 | 68.53 | 68 | 1.27% | 0.00% |
| Flip-flop 6 | 100 | 77.14 | 76 | 0.45% | 0.40% |
| Flip-flop 7 | 100 | 62.6 | 63 | 1.93% | 0.00% |
| Flip-flop 8 | 100 | 39.04 | 38 | 0.12% | 0.22% |
| Average | 100 | 60.465 | | 0.66% | |

FIG. 8

PROCESSOR-IMPLEMENTED SYSTEMS USING NEURAL NETWORKS FOR SIMULATING HIGH QUANTILE BEHAVIORS IN PHYSICAL SYSTEMS

CROSS-REFERENCE TO RELATED APPLICATIONS

This application claims priority to U.S. Provisional Application No. 62/608,744, entitled "Using Artificial Neural Networks in Estimating High Quantiles in Statistical Distributions," filed Dec. 21, 2017, the entirety of which is herein incorporated by reference.

BACKGROUND

Identification of high quantile behaviors in statistical distributions is highly desirable across many different domains. For example, failure modes of physical systems are often modelled as statistical distributions. Locating the high quantile values of a failure distribution (e.g., the three-sigma value of a system behavior based on system variabilities) can enable a manufacturer to estimate the cost of failures and designers to design products for acceptable failure rates. But accurate determination of behaviors in the tails of distributions can be resource intensive, where a three sigma behavior of a system may require consideration of 10,000 samples of system variabilities (i.e., the $99.865^{th}$ quantile is represented by the $15^{th}$ highest simulation result of 10,000 samples).

Monte Carlo sampling and simulation, which requires simulation of each of the samples, is typically used in such scenarios. But for complex systems where simulation of each sample is time consuming (e.g., taking minutes or hours) the time/resource cost for such sampling and simulation can become cost prohibitive, requiring days, weeks or longer to complete.

SUMMARY

Systems and methods are provided for simulating quantile behavior of a physical system. A plurality of parameter samples to a physical system are accessed and a subset of the parameter samples are identified, each of the plurality of parameter samples including a variation of parameters for the physical system. The physical system is simulated based on the subset of the parameter samples to generate simulation results, each of the subset of the parameter samples corresponding to a respective one of the simulation results. A neural network is trained to predict the simulation results based on the subset of the parameter samples. Simulation results are predicted for the plurality of parameter samples based on the neural network which has been trained, each of the predicted simulation results corresponding to a respective one of the plurality of parameter samples, and an indicator is generated indicating an N-th quantile simulation result of the physical system according to an ordering relationship among the plurality of simulation results.

As another example, a computer-implemented system for simulating quantile behavior of a physical system includes one or more data processors and a computer-readable medium encoded with instructions for commanding one or more data processors to execute steps of a method. In the method, a plurality of parameter samples to a physical system are accessed and a subset of the parameter samples are identified, each of the plurality of parameter samples including a variation of parameters for the physical system. The physical system is simulated based on the subset of the parameter samples to generate simulation results, each of the subset of the parameter samples corresponding to a respective one of the simulation results. A neural network is trained to predict the simulation results based on the subset of the parameter samples. Simulation results are predicted for the plurality of parameter samples based on the neural network which has been trained, each of the predicted simulation results corresponding to a respective one of the plurality of parameter samples, and an indicator is generated indicating a quantile simulation result of the physical system according to an ordering relationship among the plurality of simulation results.

As a further example, a computer-readable medium encoded with instructions for commanding one or more data processors to execute instructions to perform a method for determining a quantile behavior of a physical system. In the method, a plurality of parameter samples to a physical system are generated, each parameter sample including a variation of values for the set of design parameters. The physical system is simulated based on a subset of the parameter samples to generate simulation results, each of the subset of the parameter samples corresponding to a respective one of the simulation results. A decision network is trained based on the subset of the parameter samples to determine whether a parameter sample belongs to tail N samples of the plurality of parameter samples according to a distribution of behaviors of the physical system. The tail N samples corresponds to the quantile behavior. An indicator is generated indicating the quantile behavior of the physical system based on simulations results of the tail N samples identified among the plurality of the parameter samples by the decision network.

DESCRIPTION OF DRAWINGS

FIG. 2 is a table depicting example Monte Carlo samples for evaluating high quantile timing behavior of an integrated circuit design.

FIG. 6 depicts weighted voting for certain parameter samples by certain neural networks.

FIG. 8 is a diagram depicting an example comparison of performance between a method for simulating quantile behavior using a neural network as described herein and a process that simulates all of the parameter samples generated.

DETAILED DESCRIPTION

Figure 1:
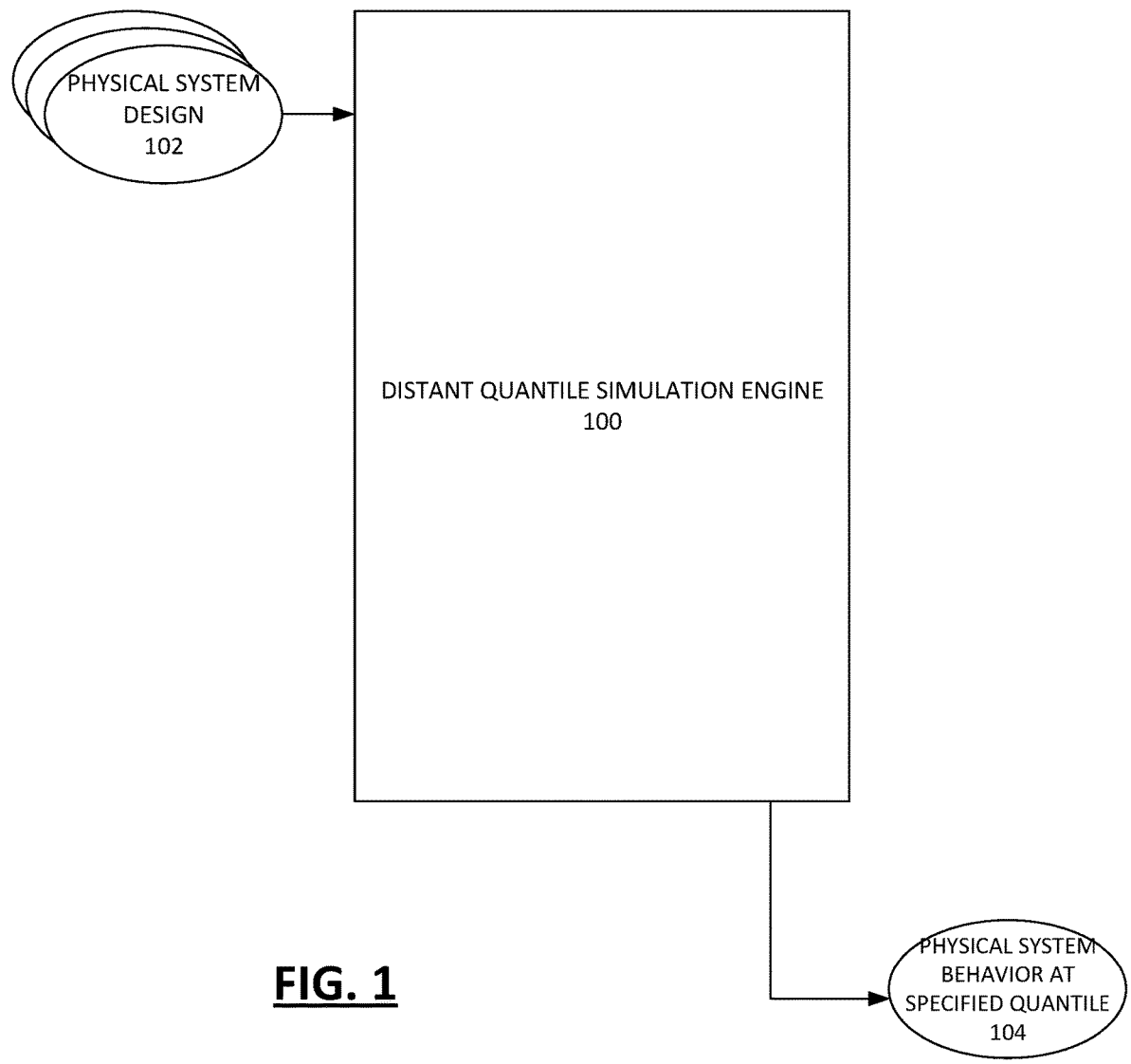
FIG. 1 is a diagram depicting a processor-implemented distant quantile simulation engine.

In statistics and the theory of probability, quantiles are cut points dividing the range of a probability distribution into contiguous intervals with equal probabilities, or dividing the observations in a sample according to the likelihood of occurrence of each observation based on the probability distribution in the same way. This implies that the function to find any quantile is the inverse cumulative density function (inverse cdf) of the statistical distribution. In most real world domains, the cdf is either not known, not invertible, or has no closed form for its inverse. In such cases, the quantile may be estimated using an estimation of the distribution, which is typically derived from Monte Carlo sampling or a mechanism based on repeated random sampling to obtain numerical results. For example, Monte Carlo sampling may include defining a domain of possible inputs, generating inputs randomly from a probability distribution over the domain, performing a deterministic computation on the inputs, and aggregating the computed results.

In one embodiment, to estimate the 99th percentile using 101 Monte Carlo samples, the simulation results associated with randomly generated parameter samples may be sorted (e.g. by comparing the values of the simulation results). The 2nd largest simulation result as sorted may correspond to the estimation of the 99th percentile. Similar approaches may be extrapolated to the circuit timing domain examples described herein, where typical design considerations may include a 99.865th quantile (which corresponds to a 3-sigma distance from the mean in a Gaussian distribution). Thus, using 10,000 Monte Carlo samples, the 99.865th quantile would lie between the 14th and the 15th simulation results after sorting, where linear interpolation between the two simulation result values is typically used to derive the final estimate.

Finding the simulation result value (may it be signal delay, timing constraint, or circuit path timing slack) of a sample is often very expensive, as simulation is typically time and resource intensive. As described above, any particular quantile is defined by simulation results associated with its two nearest parameter samples. In the case described above, only the values of the 14th and the 15th sorted simulation result are needed to derive the estimation of the 99.865th quantile. In other words, if the parameter samples (e.g. generated according to Monte Carlo sampling) can be sorted based on a technique without performing actual simulation to provide substantially the same order as their corresponding simulation result values, then only two parameter samples need to be simulated to identify the quantile estimation that the Monte Carlo sampling method would produce, without a need to simulate all of the parameter samples.

In one embodiment, a neural network is typically used to help make decisions from a finite set of possibilities (e.g. classification) as opposed to finding a certain value. A neural network may include a framework for many different machine learning algorithms to work together and process complex data inputs. A neural network used in its traditional sense can typically be sub-optimal for quantile finding. However, by turning the quantile finding problem (or mechanism) into an ordering problem, the output of the problem can be transformed from an infinite set to a finite set.

Further, total ordering of simulation results of all of the parameter samples is not required. For example, to find the 99.865th quantile in 10,000 parameter samples, ordering beyond the 15th sorted parameter sample is not relevant. In fact, precise ordering of the simulation results of the top 15 parameter samples is not necessary either. The quantile estimation mechanism can be further simplified or transformed accordingly. For example, if 15 parameter samples associated with the top 15 simulation results out of 10,000 samples are known but not the ordering of these samples, the ordering (or ordering relationship) of these samples can be obtained by simulating these 15 parameter samples. Then the 99.865th quantile can be identified based on the $15^{th}$ sorted parameter sample in the ordering of these samples. So now the problem becomes how to find the top 15 parameter samples out of 10,000 samples, a problem with a Boolean output (e.g., a parameter sample is one of the top 15 parameter samples or not). This problem transformation also allows systems and methods to search for higher quantiles without significantly increasing the number of parameter sample simulations because the method scales with the number of top parameter samples that describe the tail of the distribution instead of the total parameter samples that describe the entire distribution.

Systems and methods as described herein utilize one or more neural networks (e.g., a computer system modeled on the human brain/nervous system, such as an artificial neural network comprising a collection of connected units or nodes that transmit signals to other nodes), which may be trained on-the-fly in an efficient manner using a feedback loop, to provide high quantile simulation results. Using the systems and methods described herein, high quantile behaviors of a system can be determined in a cost efficient manner without the many simulation runs required by Monte Carlo sampling/simulation or traditional neural network training. As described further herein, the use of a neural network can reduce the number of simulations required to determine high quantile behavior by two orders of magnitude or more.

Unlike Monte Carlo sampling/simulation or other sampling based simulation methods, which have increased sampling errors when estimating higher quantiles and thus must increase the number of samples/simulations to maintain accuracy, the neural-network based systems and methods described herein can maintain high accuracy without requiring a significantly higher number of simulation runs (e.g., systems and methods herein may require less than 100 simulation runs compared to 10,000 simulation runs in a comparable Monte Carlo sampling/simulation process). The neural-network based systems and methods herein can find nearly, or in some instances exactly, the quantile estimate that a Monte Carlo sampling/simulation method would, where such Monte Carlo processes are typically considered the gold standard of estimation. Thus, systems and methods described herein incur little or no additional error over Monte Carlo sampling/simulation. And the systems and methods herein can use neural network(s) that are of generic in structure, that is they have no a priori knowledge of the physical system. In some embodiments, multiple neural networks can be utilized to speed up convergence of the system.

FIG. 1 is a diagram depicting a processor-implemented distant quantile simulation engine. The engine 100 receives a physical system design 102, for example, including a set of design parameters and a specification of a high quantile. An operator wishes to determine a behavior of a physical system corresponding to the high quantile according to the design parameters. The engine 100 performs a limited set of simulations of variances or variations of the physical system design 102 and, in conjunction with one or more neural networks, determines the requested physical system behavior 104 at the specified quantile (e.g., a high or low three-sigma (99.865th quantile) behavior).

The physical systems that can be analyzed by the distant quantile (e.g. a high quantile or any applicable quantile) simulation engine 100 can take a variety of forms. Many of the examples described herein will be explained relative to an integrated circuit design, where the integrated circuit design (e.g., a VLSI design) is subject to several manufacturing variabilities during fabrication and operation. For example, the circuit may include a number of transistors that are formed on fins on the semiconductor substrate. While those fins are designed to have a particular width (e.g., 7 nm width or other applicable width), when fabricated the width of each fin will vary according to a distribution (e.g., 99% of fins will vary between 6.1 and 7.9 nm in width or other applicable size/distribution variations). The variations in actual widths can affect system timing. For example, the propagation time of a signal through one or more transistors formed on the fins may be dependent in part on fin width.

In a Monte Carlo sampling/simulation process for determining high quantile timing behavior of that integrated circuit, many parameter samples representing variances in that integrated circuit are generated and then each simulated. FIG. 2 is a table depicting example Monte Carlo samples for evaluating high quantile timing behavior of a significantly simplified integrated circuit design example that includes three fins, designed to each have a width of 7 nm, having fabricated widths between 6.1 and 7.9 nm. A number of parameter samples X (e.g., X=10,000 parameter samples) are generated. Each parameter sample can include one or more values, for example, a value for a respective one of a plurality of system parameters that vary. In the example of FIG. 2, all of the depicted system parameters are of a common type, fin width. But in other embodiments, system parameters can be of disparate type (e.g., fin width, fin composition percentages, doping concentrations, temperature, voltages) and be much higher in number (e.g., many thousands) In a Monte Carlo sampling/simulation process, each of those X parameter samples is simulated, where the N-th highest simulated timing value (e.g., 15th highest simulation result of 10,000 simulated parameter samples) of those is representative of the requested high quantile behavior (e.g., the $99.865^{th}$ quantile). (High quantiles in the context of this application can mean low or high values positioned toward either tail of the distribution of physical system behaviors.)

Systems and methods as described herein can utilize the same set of Monte Carlo parameter samples as depicted in FIG. 2. But through use of a neural network, a comparable high quantile behavior (e.g., within 2.5% mean error, within 0.4% mean error, often 0.0% error compared to full simulation of all samples) can be determined in significantly fewer simulation runs.

Example Inputs to a Neural Network—In a circuit timing domain, variability is represented by parameters to a transistor device model. However, circuit timing also depends on the circuit topology, operating conditions, and input electrical signals. A typical usage of a neural network would turn all these factors into inputs to the network, then train and build a single network or a decision network (e.g. including one or more neural networks) that is able to solve the problem (of finding the top N samples) for all possible circuits. This is impractical considering typical circuit complexity. The network size, training set size, and amount of training would be enormous. A more manageable solution uses a more limited parameter set (e.g. a more limited set of variations of parameters instead of a full set of variations of parameters) as inputs to the neural network. Without anticipating all possible circuits and pre-building a network for each possibility beforehand, a neural network, in one embodiment, can be constructed, trained, and used on-the-fly as a particular circuit (e.g. a circuit design) is provided as an input to the system.

Example Outputs from a Neural Network—As noted above, certain embodiments of the approaches described herein can determine the top N samples given a set of generated (e.g., randomly generated) parameter samples. A neural network can be trained to determine if a given sample is in the top N samples or not. In embodiments where the neural network is constructed and trained the on-the-fly, the neural network may not be able to be trained to solve the problem directly because the knowledge of which samples are in the top N is not known at runtime, as that is the problem being solved. But a set of simulation results for parameter samples can be acquired on the fly for neural network training. That is, a neural network can be trained to output an estimate of the simulation result for a parameter directly, with the relaxed requirements that the neural network needs not produce an exact simulation result. It is not necessary for the neural network to predict sample values nor parameter sample ordering accurately, as long as the neural network can predict the top N parameter samples correctly.

Example Neural Network Training and Usage—The disclosed approach can enable on-the-fly network construction and training without manual intervention in a fully automated manner. In one embodiment, the disclosed approach can efficiently provide quantile estimation results without a need for the time and resource heavy determination of optimum network configurations to solve a particular (e.g. simulation) problem subject to guidance of heuristics, intuition, and trial and error. Such a time consuming process for generating a pre-build neural network to be used many times can be avoided in the disclosed approach.

In one embodiment, distant quantile simulation engine 100 of FIG. 1 may determine whether a given parameter sample is in a tail N (e.g. top N, bottom N, or N samples far away from a mean of) samples or not. Such a binary decision may be implemented through consensus building and iterating. Instead of finding a neural network with the optimal configuration, systems and methods build several neural networks of varying configurations and have them determine a consensus on what the top N samples are. Because it is not known ahead of time what the optimum input parameters to provide to a neural network and the best neural network training strategy to implement, a variety of neural network structures, e.g. differing in topologies, numbers of nodes, numbers of layers, numbers of inputs that receive different parameters, different training procedures, and/or other applicable neural network characteristics may be used. This is described further below with respect to FIG. 5.

As described further herein, there are several mechanisms for consensus building. In one example, a voting methodology is used, as described further below with reference to FIG. 6. Systems and methods then take top set of parameter samples predicted by consensus and simulate them. The parameter samples and their corresponding simulation results are then added to the training set of the neural networks. With new samples in the training set, the process can be repeated for convergence (e.g., the top parameters samples predicted by neural network consensus no longer changes). After convergence is reached, all the simulation results are sorted and the top N simulation results are used to determine the percentile as one would in the Monte Carlo sampling method. As long as the true top N parameter samples is a subset of the simulated parameter samples, systems and methods described herein can find the exact same percentile estimation as the Monte Carlo sampling/simulation method would.

In one example, (1) S number of parameter samples are created (e.g., as would be via Monte Carlo sampling), where each sample consists of the values of the variation parameters of each transistor device in the circuit. A goal is to find the top N samples among the set of S generated samples to estimate a given quantile Q, where $N=\text{ceiling}(S*(1-Q))+1$, represented as a relationship between N tail (or top, bottom) samples corresponding to quantile Q. Quantile Q would lie in between the N−1-th and the N-th top samples. For example, if searching for the 99.865th quantile among 10,000 samples, one would need to find the top $N=\text{ceiling}(10,000*(1-0.99865))+1=15$ samples and the desired quantile lies between the 14th and the 15th samples. Next, (2) T number of parameter samples are randomly selected from the set of S samples to simulate and serve as initial training set. (3) Multiple neural networks with different network configurations are trained using the same training set of parameter samples and their corresponding simulation results. The neural networks are trained by presenting the training set multiple times called epochs. (4) After several predetermined epochs of training, the neural networks predict the values of simulations results for the full set of S samples. Each neural network trained can generate a set of S values to predict the simulation results. A set of S values as predicted by each neural network trained can be sorted to identify a top N samples corresponding to the respective neural network.

In one embodiment, multiple sets of the top N samples corresponding to the neural networks can be aggregated by a voting mechanism to determine which samples are in the top N samples. For example, a parameter sample may be designated as in the N top samples according to the voting mechanism if this parameter sample is determined as in the N top samples by a majority, more than a specified number, or other applicable combination) of the multiple neural networks. The voting results (or results of the voting mechanism) can be used to predict a set of parameter samples voted to be in the top N samples as a result set for the predetermined epochs of training.

According to some embodiments, any samples in this result set of the N top samples that have not yet been simulated are simulated and added to the training set for a next iteration of training. Step 4 is repeated if any new parameter samples are added to the result set. When no parameter samples are added to the result set, the process is considered converged. (5) Once converged, the simulation results are sorted to determine quantile Q using N−1-th and N-th sorted simulation results.

Figure 3:
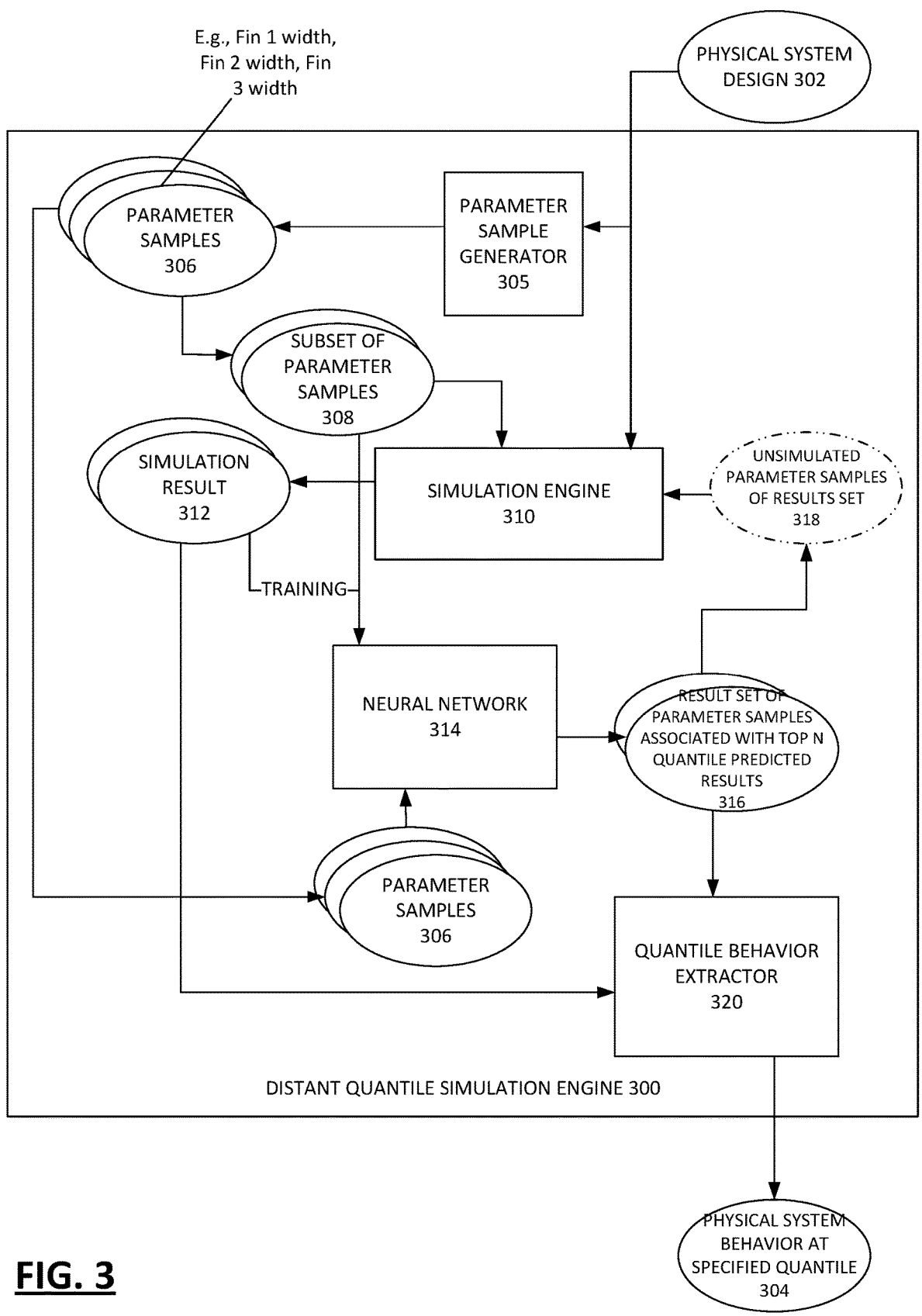
FIG. 3 is a diagram depicting a processor-implemented distant quantile simulation engine using one neural network.

FIG. 3 is a diagram depicting a processor-implemented distant quantile simulation engine using one neural network in accordance with one embodiment. A distant quantile simulation engine 300 receives a physical system design 302 and a request to determine a physical system behavior at a specified quantile 304. In one embodiment engine 300 may be based on engine 100 of FIG. 1. The engine 300 includes a parameter sample generator 305 that generates a plurality of parameter samples to the physical system 308 (e.g., each of 10,000 parameter samples corresponding to one row of the table depicted in FIG. 2 through random selection of a fin width according to a distribution for each element of each row). A subset of the parameter samples 306 (e.g., 30 of 10,000) is extracted or selected at 308 and provided to a simulation engine 310. The number of the subset of parameter samples selected may be substantially smaller then the total number of parameter samples 306 for speedy simulation of all the parameter samples in the subset. In one embodiment, sample 308 may be randomly selected from sample 306. The simulation engine simulates the physical system design 302 based on each parameter sample in the subset of parameter samples 308 to generate simulation results 312, each of the subset of parameter samples 308 corresponding to a respective one of the simulation results 312.

A neural network 314 is trained based on each of the subset of parameter samples 308 and its corresponding simulation result 312 to form a neural network that predicts simulation results that mimic the simulation of the physical system 302 by the simulation engine 310. Each of the parameter sample 308/simulation result 312 pairs may be cycled through the neural network 314 a pre-specified number of times, sometimes referred to as epochs, during training. Once the neural network 314 is trained based on the initial set (e.g., 30) of simulation results 312, a larger set of parameter samples to the physical system 306 (e.g., 10,000 parameter samples) is run through the trained neural network 314 to predict a simulation result for each of the parameter samples 306, each of the predicted simulation results corresponding to a respective one of the plurality of parameter samples 306. The predicted simulation results are sorted to identify a top N predicted simulation results, where N may correspond to the specified quantile (e.g., N=15 for 10,000 samples) in some embodiments or may be user-specified or otherwise set (e.g., N=30). The parameter samples associated with the top N quantile predicted results form a result set of parameter samples 316.

The result set of parameter samples 316 is evaluated to determine whether further simulations should be performed by the simulation engine 310 or whether the process has converged such that the physical system behavior 304 can be determined. For example, the member parameter samples of the result set 316 can be compared to the parameter samples that have been previously simulated by the simulation engine 310 (i.e., the subset of parameter samples 308 after a first pass to 316). If the result set 316 includes parameter samples that have not been simulated by the simulation engine 310, the unsimulated members of the result set 318 are simulated to generate additional simulation results 312, each additional simulation result 312 corresponding with an unsimulated parameter sample of the result set 318. The neural network 314 is further trained based on the unsimulated parameter samples 318 and their corresponding additional simulation results 312 (e.g., for a number of epochs each).

Following the additional training, the parameter samples to the physical system 306 are again provided to the neural network 314 to predict simulation results for the plurality of parameter samples. Those predicted simulation results are sorted to form a new result set of N parameter samples 316. The process of simulating unsimulated parameter samples in the result set 318, further training the neural network 314, and generating a new set of N parameter samples 316 is repeated until the new result set 316 contains no unsimulated parameter samples 318.

When the result set 316 contains no unsimulated members, the process is considered converged. A quantile behavior extractor 320 evaluates all of the at least N simulation results 312 or the N top samples as determined from the simulation engine to determine the N-th quantile simulation result of the physical system (e.g., via an ordering or sorting operation). The N-th quantile simulation result is output at 304.

Figure 4:
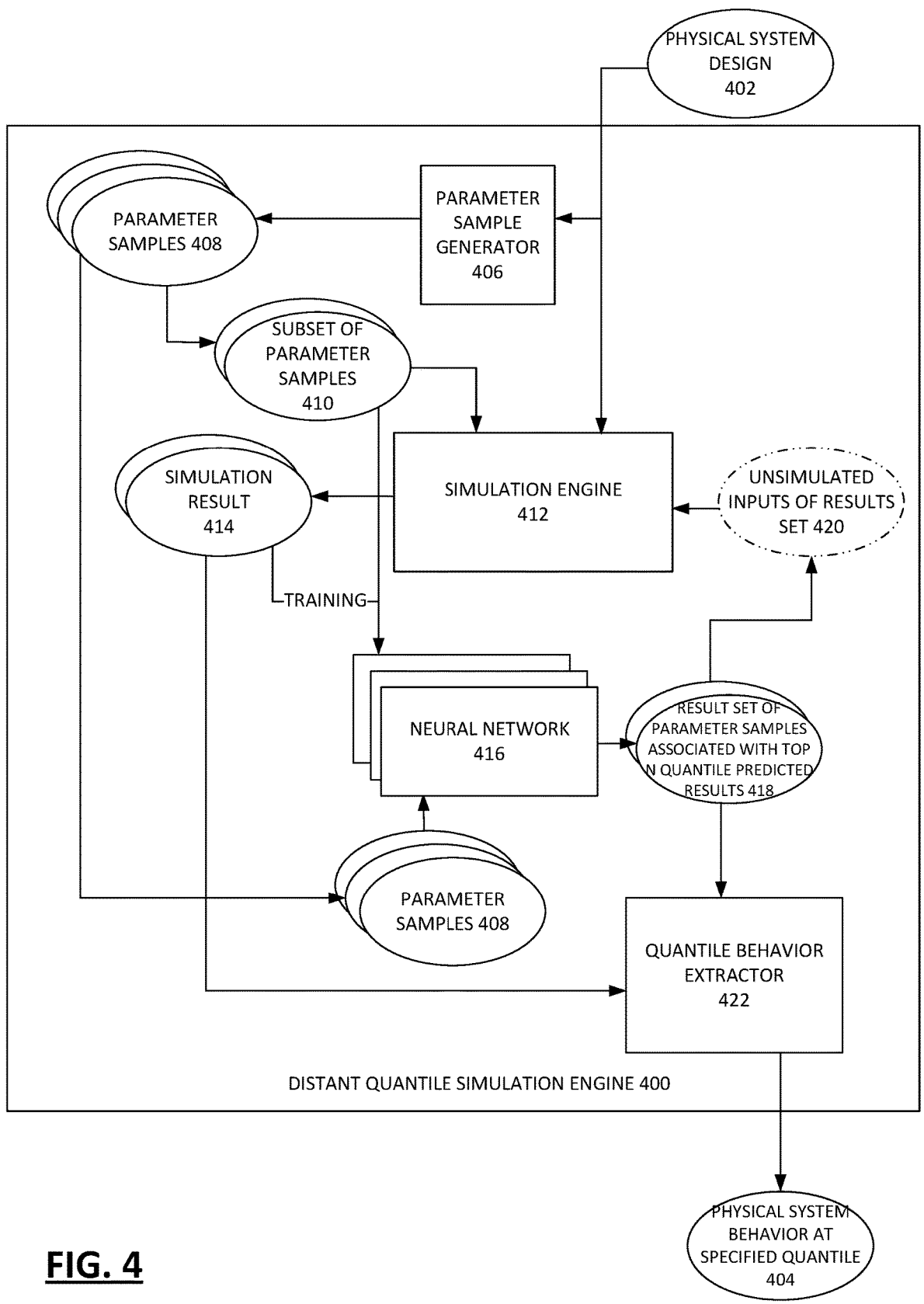
FIG. 4 is a block diagram depicting a distant quantile simulation engine that utilizes multiple neural networks.

As noted above, in some embodiments multiple neural networks can be utilized to speed convergence. FIG. 4 is a block diagram depicting a distant quantile simulation engine that utilizes multiple neural networks. The system of FIG. 4, in some embodiments, functions similarly in several aspects to the example of FIG. 3, for example, based on engine 100 of FIG. 1. The distant quantile simulation engine 400 receives a physical system design 402 and a request for a physical system behavior at a specified quantile 404. A parameter sample generator 406 generates a plurality of parameter samples to the physical system 408, each representing a variation of parameters of the physical system 402. Those parameter samples 408 are accessed to identify a subset of the parameter samples 410. A simulation engine 412 simulates the physical system 402 based on the subset of the parameter samples 410 to generate simulation results 414. A plurality of neural networks 416 are trained based on the simulation results 414 and each of their corresponding parameter samples 410 (e.g. parameter sample 410 may include additional parameter samples with additional training iterations). As described further below, each of the neural networks 416 may be different in one or more aspects, such as structure (e.g., different number of hidden layers, different number of input nodes, different number of output nodes), parameters accepted (e.g., different subsets parameters from a pool of parameters, where the simulation engine 412 may utilize all or most of those parameters in generating simulation results), and training procedure (e.g., number of epochs for each parameter sample/simulation result pair).

Once the neural networks 416 are trained, the parameter samples to the physical system 408 are provided to each of the neural networks 416 to predict simulation results for each of the parameter samples 408. In one embodiment, each of the neural networks 416 predicts a simulation result for each parameter sample 408 and ranks its predicted simulation results. The result set of parameter samples associated with a top N quantile predicted simulation results 418 (e.g., one result set of 15 parameter samples) is determined based the neural network predictions (e.g., based on a weighted voting process as described below). Having the result set of parameter samples 418, the engine 400 determines whether the result set 418 contains unsimulated parameter samples 420. If so, the unsimulated parameter samples 420 are simulated by the simulation engine, and the corresponding simulation result/parameter sample pairs are used to further train the neural network 416, whereby the neural networks 416 predict new simulation results for the parameter samples 408 to form an updated result set 418. That simulation of unsimulated parameter samples 420, retraining, and predicting to form an updated result set 418 is repeated until the result set 418 contains no unsimulated parameter samples 420. In some embodiments, more than one of neural networks 416 may be trained and activated for generating predictions in parallel.

When the result set 418 contains no unsimulated members, the process is considered converged, and a quantile behavior extractor 422 evaluates all of the at least N simulation results 414 from the simulation engine to determine the N-th quantile simulation result of the physical system (e.g., via an ordering or sorting operation). For example, extractor 422 can sort the N top samples determined according to the simulation results. The N-th quantile simulation result is output at 304.

Figure 5:
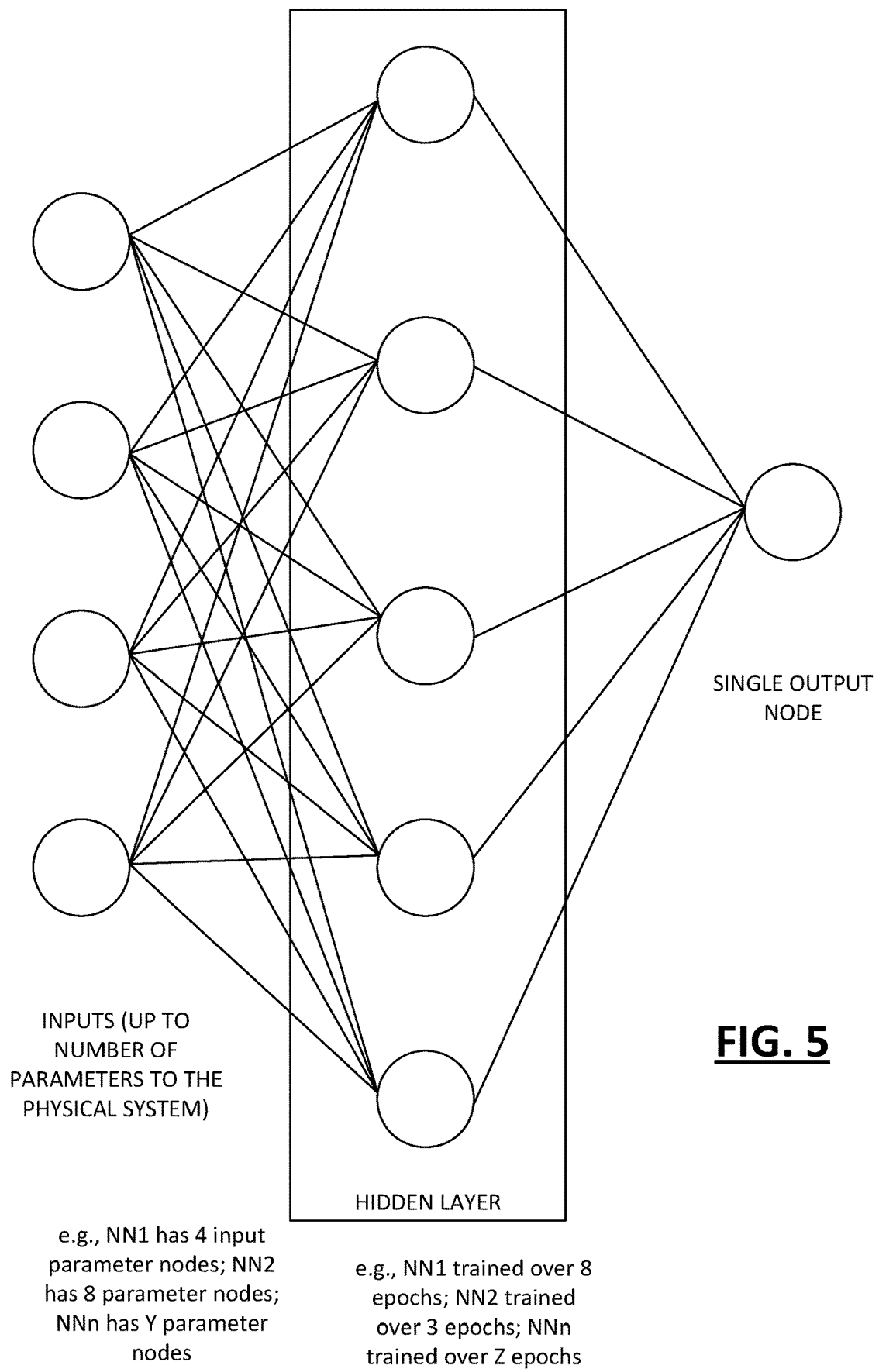
FIG. 5 depicts neural networks of varying structure and training process.

As noted above, in the example of FIG. 4, each of the neural networks may differ in structure (e.g., number of layers, number of nodes in particular layers) and training process. In one example, each of the neural networks includes one hidden layer, one output node, and a differing number of input nodes that receive differing physical system parameters from a larger pool of physical system parameters. In the example of FIG. 5, a first neural network (depicted) has 4 input nodes and is trained by each parameter sample/simulation result pair over 8 epochs. A second neural network has 8 input nodes that receive different system parameters and is trained over 3 epochs. An N-th neural network has Y input nodes and is trained over Z epochs.

As noted above, predicted simulation results for multiple neural networks can be synthesized via a variety of mechanisms, such as a voting mechanism. In one example, predicted results can be aggregated to find a top N predicted results, with or without consideration of multiple predicted results from a common parameter sample. In another example, a weighted voting process can be used. FIG. 6 depicts weighted voting for certain parameter samples by certain neural networks. In this example, a first neural network predicts that the first parameter sample will produce the highest simulation result. The second neural network predicts that the first parameter sample will produce the $8^{th}$ highest result, and the L-th neural network predicts that the first parameter sample will produce the $31^{st}$ highest result. For the second parameter sample, the first neural network predicts that the second parameter sample will produce a $10^{th}$ highest result, the second neural network predicts the $4^{th}$ highest result, and the L-th neural network predicts that the second parameter sample will produce the $9^{th}$ highest result. For the M-th parameter sample, the first neural network, the second neural network, and the third neural network predict that the M-th parameter sample will produce the $105^{th}$, $88^{th}$, and $12^{th}$ highest simulation result, respectively.

In the weighted voting example of FIG. 6, a neural network indicating an parameter sample will produce a highest result is worth 15 votes, a neural network indicating an parameter sample will produce a second highest result is worth 14 votes, with the number of votes declining by one per ranking down to the parameter sample that the neural network predicts will produce the $15^{th}$ highest result being worth a single vote. In the example of FIG. 6, votes are tallied based on the depicted neural network predictions such that the first parameter sample receives 23 votes, the second parameter sample receives 25 votes, and the M-th parameter sample receives 4 votes. A ranking of those three parameter samples would be: 1. Parameter Sample 2 (25 votes); 2. Parameter Sample 1 (23 votes); and 3. Parameter Sample M (4 votes). If three or more parameter samples (i.e., "N" as discussed herein above) must be simulated to determine a quantile simulation result, then a determination is made as to whether each of Parameter Sample 2, Parameter Sample 1, and Parameter Sample M have, and any other parameter samples up to rank N have been simulated. If not, those unsimulated parameter samples of the ranked set are simulated for use in further training the neural networks. If not, the process is considered converged.

With reference back to FIG. 4, the output of a neural network 416 may take a variety of forms that can be used to determine the result set 418. In one embodiment, output of the neural network 416 is a predicted simulation result for each parameter sample 408, whereby the parameter samples to be included in the result set 418 are determined (e.g., as described above with respect to the voting example of FIG. 6) by functionality external to a procedure or object in which the neural network 416 is operating. In another example, the procedure or object executing each neural network 416 may determine a rank of the parameter sample 408 based on the corresponding predicted simulation results of that neural network 416.

In one embodiment, the procedure or object operating a particular neural network 416 stores its predicted simulation results for the parameter samples 408, sorts those predicted simulation results, and assigns a rank to the corresponding top N parameter samples 408, where that rank is output from the procedure or object executing the particular neural network 416. In another embodiment, the procedure or object executing the neural network 416 outputs a Boolean/binary value for each parameter sample 408 that indicates whether that parameter sample 408 is in the N parameter samples 408 of the result set 418. In embodiments utilizing a single neural network (e.g., as depicted in FIG. 3 at 314), that single neural network may operate similarly. Sorting or ranking may be performed based on a ranking/sorting engine. Neural networks 416 may include multiple ranking/sorting engines or at least one shared ranking/sorting engine.

As noted above, the number of design parameters that may vary in a process (e.g., a physical system fabrication) can be very large (e.g., thousands, millions). It may be desirable for a simulation engine, as described herein, to consider all or many of these design parameters. But the influence of many of those design parameters on the simulation result of interest may be limited. Thus, it may be desirable to limit the set of design parameters that are available for use in input nodes to the neural network(s) described herein. In one embodiment, design parameters for use as parameters to the physical system can be filtered based on characteristics of the physical system. For example, when the physical system is an electronic circuit, and a switching event of interest is propagating through that circuit, not all circuit elements are active, especially in complex circuits like multiplexers, latches, flops, and and-or-invert circuits. Process variations in inactive elements have little to no impact on overall timing of a switching event. Thus, a number of design parameters can be eliminated by inspecting circuit topology.

Figure 7:
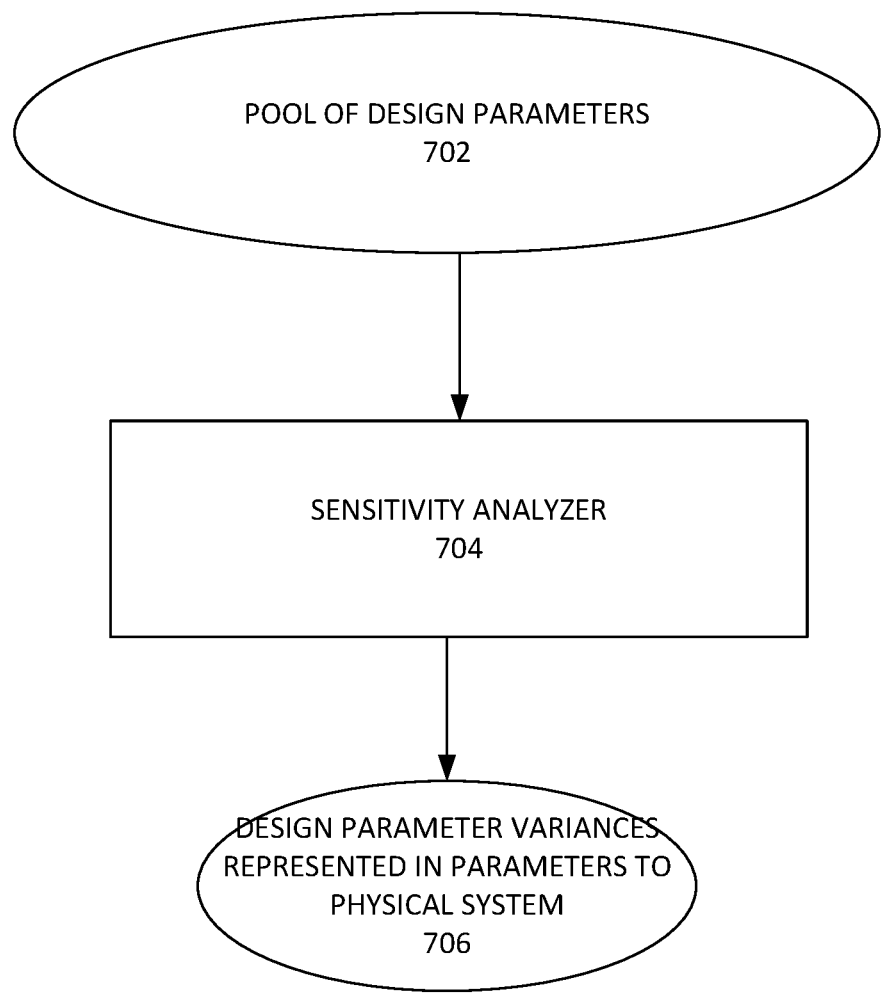
FIG. 7 is a flow diagram depicting an example process for determining design parameter variances to be represented in the parameter samples to the physical system.

FIG. 7 is a flow diagram depicting another example process for determining design parameter variances to be represented in the parameters to the physical system. At 702, a global pool of design parameters is accessed. At 704, a sensitivity analyzer processes the design parameters from 702 to identify design parameters for use as neural network input parameters. For example, the sensitivity analyzer 704 may utilize a simulation engine to perform one or more simulations of the physical system, varying certain of the design parameters from 702 to determine an amount of change in the simulation result based on the variations in the design parameters 702. Parameters whose variation has little effect on the simulation result may be left out of the design parameter variances represented in the parameters to the physical system 706 used in the neural network(s), while design parameters whose variance has a larger effect on the simulation result may be included at 706.

For example, a simulation of parameter v1=−1 and another simulation with parameter v1=1 may be separately performed while keeping all other parameters the same. With the results from the two simulations, the partial derivative (or a sensitivity) of the timing result with respect to parameter v1 can be obtained or computed. Importance of the parameter may be directly proportional to the magnitude of the partial derivative. All the variables may be ranked according to the importance measured and only the top number (e.g. as configured or specified) most important variables are used as inputs to a neural network. While this may be an expensive way of computing input variable importance, the ranking may be shared between circuits of similar topology or the same circuit with different input waveforms.

There may also be many techniques to reduce the time/resource cost of such sensitivity analysis. For example, a transistor only has the most impact on the channel connected region (CCR) connecting to the transistor and its neighboring CCR's, so analyzing the importance of a process variation parameter on a transistor may not need to extend the simulation beyond the circuit immediately connected to the transistor, which can significantly improve simulation speed in some instances.

Systems and methods as described herein can, in some embodiments, provide a dramatic improvement in required processing time to determine a high quantile simulation result of a physical system. In one example, systems and methods as described herein can determine a simulation result in substantially fewer simulations of parameter samples (e.g., less than 100 of 10,000 parameter samples) while providing simulation results that are within 2.5% mean error, within 0.4% mean error, and often 0.0% error, compared to full simulation of all (e.g., 10,000 parameter samples). FIG. 8 is a diagram depicting an example comparison of performance between a method for simulating quantile behavior using a neural network as described herein and a process that simulates all of the parameter samples generated. In simulating different flip flops in an integrated circuit design, convergence was achieved in between 39.04 and 77.14 simulations of parameter samples on average (mean) and 38-76 simulations median compared to 10,000 simulations of a traditional Monte Carlo sampling/simulation process. Mean error was between 0 and 2.27% in absolute value, with a median error compared to full simulation of 0.00% to 0.40%.

Example: Using a Neural Network to Estimate Quantiles of Circuit Path Slack—Path slack is the amount of time by which a circuit path has met its timing requirement. The timing requirement is defined by the timing constraint on the capture element (e.g., a flip-flop) of the path. To compute the path slack, one may know the path delays, both the launch and capture path, as well as the timing constraint value of the capture element. A circuit path violates its timing requirement when the path slack is negative. A circuit designer may seek to make sure the low quantile (typically 0.015th quantile) of the slack distribution is non-negative for all circuit paths. Simulating a circuit path for path slack may be very expensive. For just a single path, it could take weeks to simulate 10,000 samples in order to estimate the quantile. In one example, two paths from a 10 nm SoC design is selected:

Path 1, 47 cells, simulations performed: 99, error: 0.0
Path 2, 67 cells, simulations performed: 125, error: 0.0

Due to a path encompassing the timing constraint of the capture element as well as the signal delay for many cells along the path, neural networks used for path slack may utilize many input nodes. But similar to timing constraint percentile estimation, neural network methods as described herein can decrease the number of simulations needed by 89× with no additional error when compared to the Monte Carlo sampling method.

Figure 9:
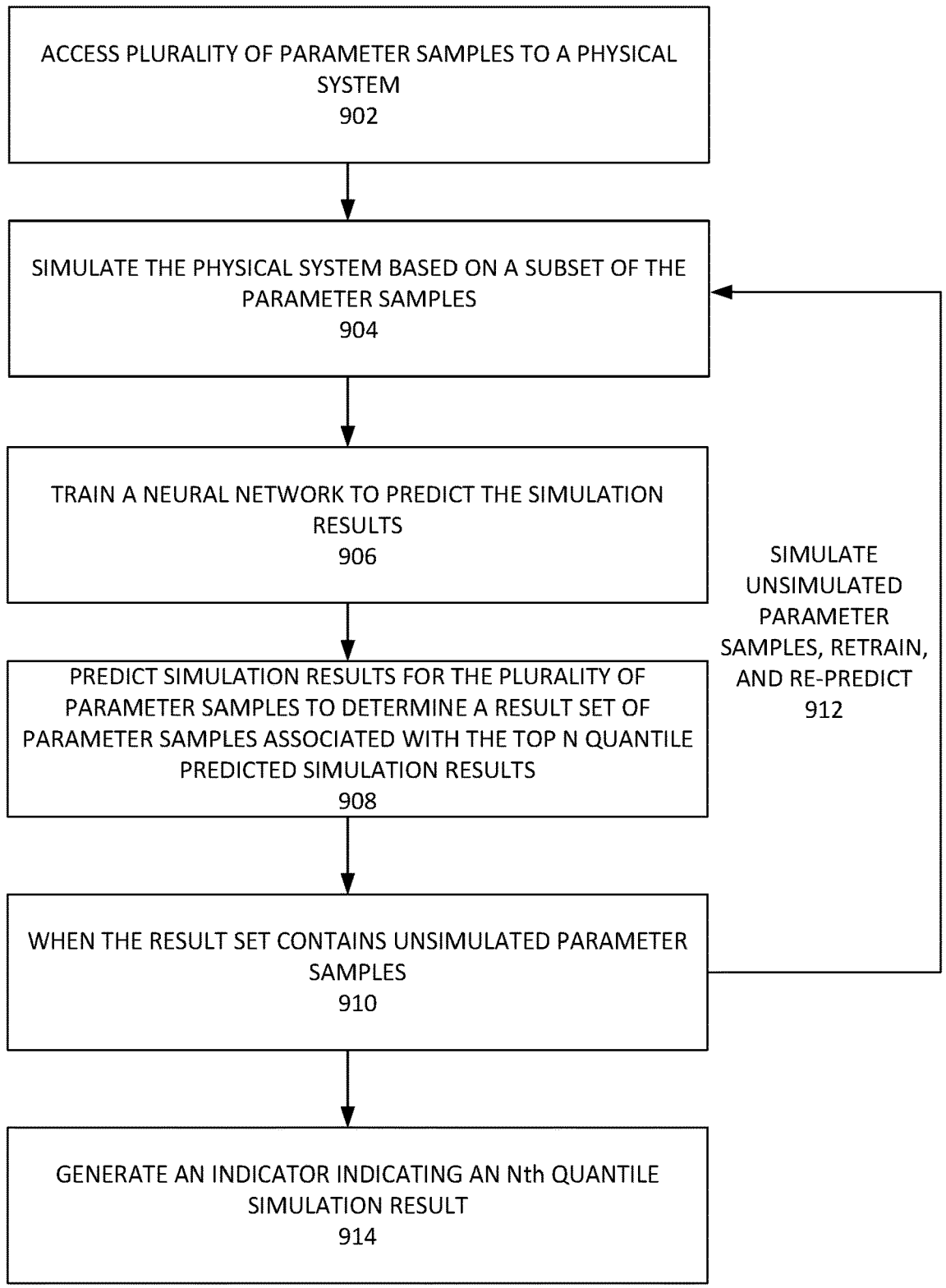
FIG. 9 is a flow diagram depicting a processor-implemented method for simulating quantile behavior of a physical system.

FIG. 9 is a flow diagram depicting a processor-implemented method for simulating quantile behavior of a physical system. At 902, a plurality of parameter samples to a physical system are accessed and a subset of the parameter samples are identified, each of the plurality of parameter samples including a variation of parameters for the physical system. At 904, the physical system is simulated based on the subset of the parameter samples to generate simulation results, each of the subset of the parameter samples corresponding to a respective one of the simulation results. At 906, a neural network is trained to predict the simulation results based on the subset of the parameter samples. At 908, simulation results are predicted for the plurality of parameter samples based on the neural network which has been trained, each of the predicted simulation results corresponding to a respective one of the plurality of parameter samples. When a result set of the plurality of parameter samples associated with the tail N samples predicted simulation results includes unsimulated parameter samples, those unsimulated members of the result set are simulated and the neural network is further trained based on the corresponding simulation results as illustrated at 910, 912. When the result set does not contain any unsimulated parameter samples, an indicator (e.g., one or more data values presented via a user interface or included in a message sent through a network interface) is generated indicating an N-th quantile simulation result of the physical system according to an ordering relationship among the plurality of simulation results at 914. The N-th quantile simulation result may be determined based on the actual simulation results of the tail N samples.

Systems and methods as described herein can simulate a requested quantile behavior of a physical system (e.g., a timing characteristic at the $99.865^{th}$ quantile). In some embodiments, the physical system is built or changed based on the simulation result (e.g., the indicator of the N-th quantile simulation result), or a design of the physical system is changed based on a simulation result. For example, where a timing characteristic of an integrated circuit is insufficient (e.g., a delay is too long, a constraint, a slope, or a slew are out of spec) at the $99.865^{th}$ quantile, as predicted by the systems and methods described herein, the design of the integrated circuit can be changed or an already built integrated circuit can be augmented to compensate (e.g., by increasing power supplied to a cell, by positioning cells in a path closer together). Systems and methods as described herein can then, in some instances, be re-run to determine whether the simulated timing characteristic of the updated design meets required specifications.

Systems and methods as described herein may be performed using a simulation engine, which may take the form of a computer-implemented simulation engine for executing a simulation, such as through the use of software instructions stored on a non-transitory computer-readable medium. A simulation, in one embodiment, is a computer-implemented imitation of a real-world process or system using one or more models. The models, in that example, represent characteristics, behaviors, and functions of selected physical systems or processes (e.g., the behavior of the one or more objects in the region of interest, the behavior of radar waves approximated by one or more rays transmitted in the simulation). The models represent behaviors of the system, while the simulation represents the operation of the system over time. A simulation result represents a characteristic of the physical system, as represented by the simulation, at one or more point within the simulation (e.g., at the end of the simulation, at t=35 seconds into the simulation).

Figure 10A:
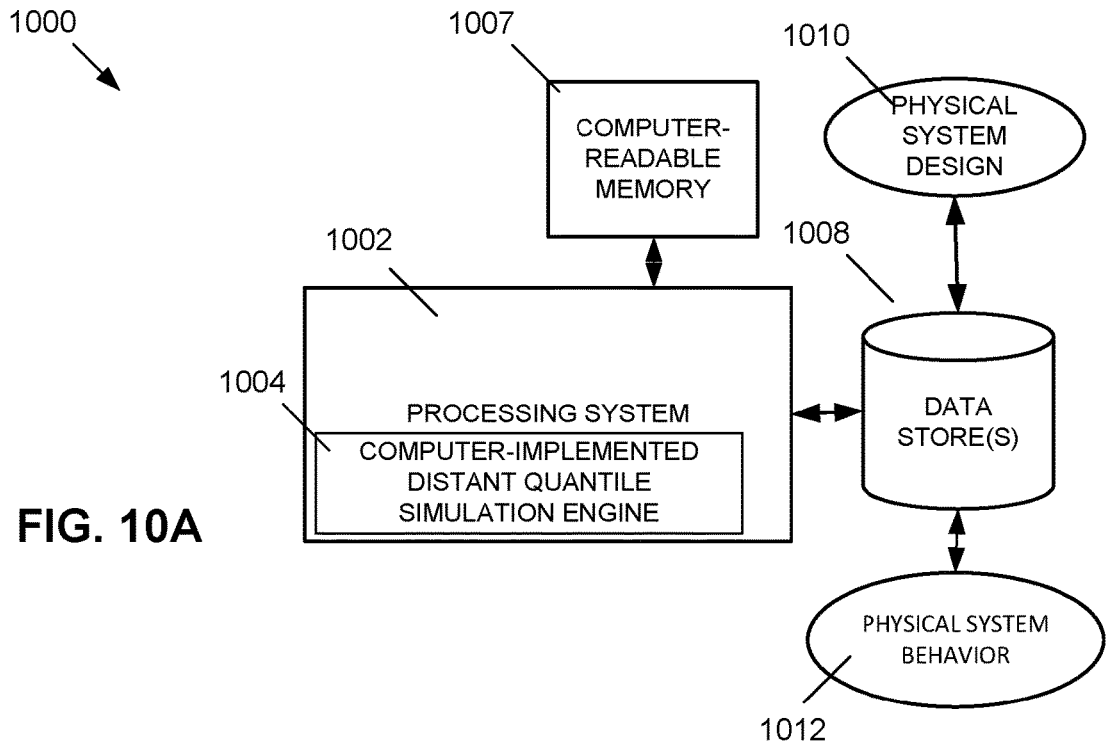
FIGS. 10A, 10B, and 10C depict example systems for implementing the approaches described herein for automatically simulating quantile behavior of a physical system.
Figure 10B:
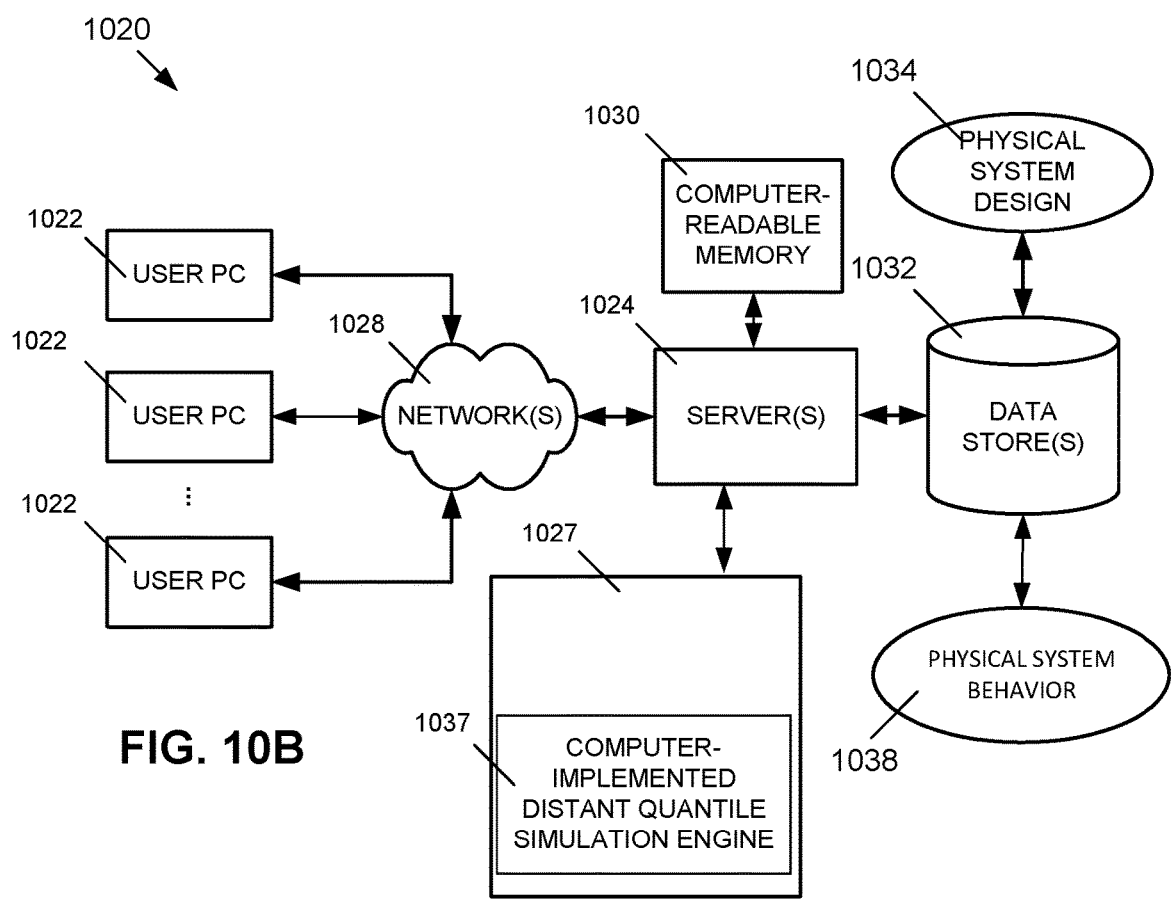
Figure 10C:
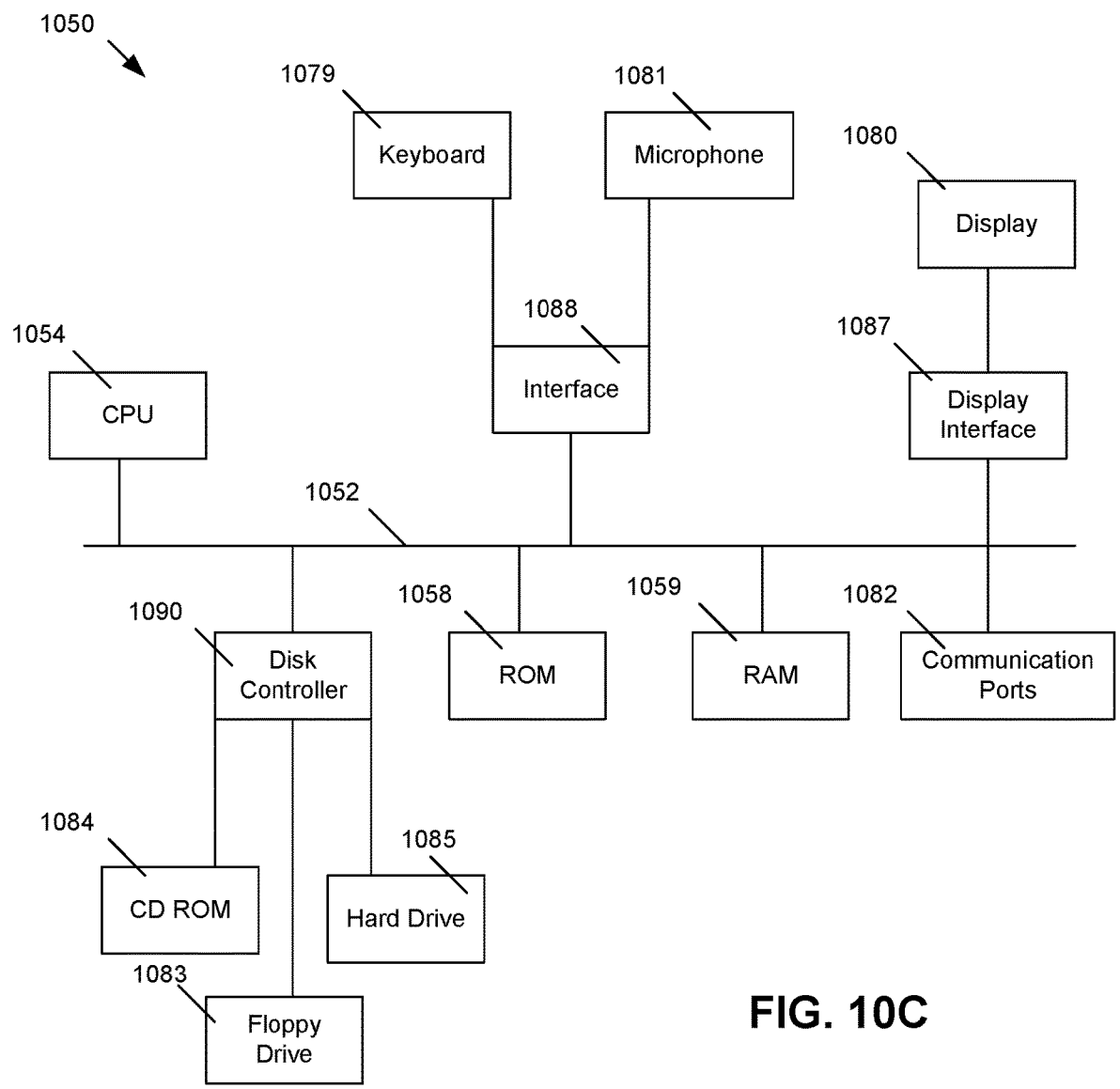

FIGS. 10A, 10B, and 10C depict example systems for implementing the approaches described herein for automatically simulating quantile behavior of a physical system. For example, FIG. 10A depicts an exemplary system 1000 that includes a standalone computer architecture where a processing system 1002 (e.g., one or more computer processors located in a given computer or in multiple computers that may be separate and distinct from one another) includes a computer-implemented distant quantile simulation engine 1004 being executed on the processing system 1002. The processing system 1002 has access to a computer-readable memory 1007 in addition to one or more data stores 1008. The one or more data stores 1008 may include a physical system design database 1010 as well as a physical system behavior database 1012. The processing system 1002 may be a distributed parallel computing environment, which may be used to handle very large-scale data sets.

FIG. 10B depicts a system 1020 that includes a client-server architecture. One or more user PCs 1022 access one or more servers 1024 running a distant quantile simulation engine 1037 on a processing system 1027 via one or more networks 1028. The one or more servers 1024 may access a computer-readable memory 1030 as well as one or more data stores 1032. The one or more data stores 1032 may include a physical system design database 1034 as well as a physical system behavior database 1038.

FIG. 10C shows a block diagram of exemplary hardware for a standalone computer architecture 1050, such as the architecture depicted in FIG. 10A that may be used to include and/or implement the program instructions of system embodiments of the present disclosure. A bus 1052 may serve as the information highway interconnecting the other illustrated components of the hardware. A processing system 1054 labeled CPU (central processing unit) (e.g., one or more computer processors at a given computer or at multiple computers), may perform calculations and logic operations required to execute a program. A non-transitory processor-readable storage medium, such as read only memory (ROM) 1058 and random access memory (RAM) 1059, may be in communication with the processing system 1054 and may include one or more programming instructions for performing the method of automatically simulating quantile behavior of a physical system. Optionally, program instructions may be stored on a non-transitory computer-readable storage medium such as a magnetic disk, optical disk, recordable memory device, flash memory, or other physical storage medium.

In FIGS. 10A, 10B, and 10C, computer readable memories 1007, 1030, 1058, 1059 or data stores 1008, 1032, 1083, 1084, 1088 may include one or more data structures for storing and associating various data used in the example systems for automatically simulating quantile behavior of a physical system. For example, a data structure stored in any of the aforementioned locations may be used to store data from XML files, initial parameters, and/or data for other variables described herein. A disk controller 1090 interfaces one or more optional disk drives to the system bus 1052. These disk drives may be external or internal floppy disk drives such as 1083, external or internal CD-ROM, CD-R, CD-RW or DVD drives such as 1084, or external or internal hard drives 1085. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 1090, the ROM 1058 and/or the RAM 1059. The processor 1054 may access one or more components as required.

A display interface 1087 may permit information from the bus 1052 to be displayed on a display 1080 in audio, graphic, or alphanumeric format. Communication with external devices may optionally occur using various communication ports 1082.

In addition to these computer-type components, the hardware may also include data input devices, such as a keyboard 1079, or other input device 1081, such as a microphone, remote control, pointer, mouse and/or joystick.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein and may be provided in any suitable language such as C, C++, JAVA, for example, or any other suitable programming language. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

It is claimed:

1. A processor-implemented method for simulating quantile behavior of a physical system, comprising:
accessing a plurality of parameter samples to a physical system, each parameter sample including a variation of values for a set of parameters of the physical system;
simulating the physical system to generate simulation results of a first subset of the parameter samples, each of the first subset of the parameter samples corresponding to a respective one of the simulation results of the first subset of the parameter samples;
training a neural network using the simulation results of the first subset of the parameter samples from the first subset of the parameter samples;
executing the trained neural network to generate a plurality of predicted simulation results from the plurality of parameter samples;
identifying a second subset of the parameter samples corresponding to a subset of the predicted simulation results identified based on a quantile of the predicted simulation results; and
further training the neural network using the simulation results of the identified second subset of the parameter samples, the further trained neural network for generating an indicator indicating a quantile simulation result of the physical system.

2. The method of claim 1, wherein the quantile of the predicted simulation results is determined based on N tail samples of the predicted simulation results according to an ordering relationship, and wherein the subset of the predicted simulation results include the tail N of the predicted simulation results.

3. The method of claim 2, further comprising:
generating the simulation results of the identified second subset of the parameter samples based on the simulation results of the first subset of the parameter samples.

4. The method of claim 3, wherein the generation of the simulation results the identified second subset of the parameters samples comprises:
determining whether each of the identified second subset of parameter samples has been simulated.

5. The method of claim 4, wherein one or more of the identified second subset of the parameter samples has not been simulated, the method further comprising:
simulating the physical to generate simulation results of the one or more of the identified second subset of the parameter samples.

6. The method of claim 2, wherein a procedure or object including the neural network outputs a binary value for each parameter sample indicating whether that parameter sample is in the identified second subset of the parameter samples.

7. The method of claim 1, wherein multiple neural networks are trained to generate the predicted simulation results;
wherein the predicted simulation results are generated by each of the multiple neural networks based on the plurality of parameter samples;
wherein the identified second subset of the parameter samples is determined based on outputs of the multiple neural networks.

8. The method of claim 7, wherein the identified second subset of the parameter samples is determined based on weighted voting from the multiple neural networks.

9. The method of claim 7, wherein when one or more of the identified second subset of the parameter samples has not been simulated, unsimulated members of the identified second subset of the parameter samples are simulated and each of the multiple neural networks is further trained based on corresponding simulation results.

10. The method of claim 7, wherein the multiple neural networks have different network structures.

11. The method of claim 10, wherein the multiple neural networks each configured to receive a different number of the parameter variations or are trained using a different number of training cycles.

12. The method of claim 1, wherein the physical system is an integrated circuit system comprising a plurality of cells.

13. The method of claim 12, wherein the behavior relates to a delay of a path of cells in the integrated circuit.

14. The method of claim 12, wherein the parameter samples represent manufacturing variations of a cell in the integrated circuit.

15. The method of claim 1, wherein the each of the parameters is associated with a manufacturing variability of the integrated circuit system being simulated.

16. The method of claim 15, further comprising determining the manufacturing variabilities to be represented in the parameter samples to the physical system.

17. The method of claim 1, further comprising building or changing the physical system or changing a design of the physical system based on the quantile simulation result.

18. A computer-implemented system for simulating quantile behavior of a physical system, comprising:
    one or more data processors;
    one or more computer-readable mediums encoded with instructions for commanding the one or more data processors to execute steps comprising:
        accessing a plurality of parameter samples to a physical system and identifying a subset of the parameter samples, each parameter sample including a variation of values for a set of parameters of the physical system;
        simulating the physical system based on the subset of the parameter samples to generate simulation results, each of the subset of the parameter samples corresponding to a respective one of the simulation results;
        training a neural network on-the-fly and subsequent to the simulating to predict the simulation results based on the subset of the parameter samples;
        predicting a plurality of simulation results for the plurality of parameter samples based on the neural network which has been trained, each of the plurality of simulation results corresponding to a respective one of the plurality of parameter samples; and
        generating an indicator indicating a quantile simulation result of the physical system according to an ordering relationship among the plurality of simulation results.

19. A computer-readable medium encoded with instructions, which when executed by one or more data processors, cause the one or more processors to perform a method for determining a quantile behavior of a physical system, the steps comprising:
    receiving a set of design parameters of the physical system;
    generating a plurality of parameter samples, each parameter sample including a variation of values for the set of design parameters;
    simulating the physical system based on a subset of the parameter samples to generate simulation results, each of the subset of the parameter samples corresponding to a respective one of the simulation results;
    training a decision network based on the subset of the parameter samples, the decision network trained to determine whether a parameter sample belongs to tail N samples of the plurality of parameter samples according to a distribution of behaviors of the physical system, wherein simulation results of the tail N samples correspond to the quantile behavior of the physical system;
    identifying the tail N samples among the plurality of parameter samples based on the decision network; and
    generating an indicator indicating the quantile behavior of the physical system based on the simulations results of the tail N samples;
    wherein the decision network includes two or more neural networks that each comprise a plurality of input nodes, hidden layers, and output nodes that receive differing physical system parameters from a larger pool of physical system parameters, and wherein the neural networks are trained to predict the simulations results of the subset of parameter samples.

20. The computer-readable medium of claim 19, wherein the neural networks are trained on the fly using a feedback loop to predict the simulations results of the subset of parameter samples.

* * * * *